(12) United States Patent
Chen et al.

(10) Patent No.: US 12,042,045 B2
(45) Date of Patent: Jul. 23, 2024

(54) SLIDE RAIL ASSEMBLY

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Hsiu-Fen Chiu, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 642 days.

(21) Appl. No.: 17/317,839

(22) Filed: May 11, 2021

(65) Prior Publication Data

US 2022/0095793 A1 Mar. 31, 2022

(30) Foreign Application Priority Data

Sep. 30, 2020 (TW) .................................. 109134527

(51) Int. Cl.
| | | |
|---|---|---|
| A47B 88/423 | (2017.01) | |
| A47B 88/407 | (2017.01) | |
| A47B 88/49 | (2017.01) | |
| A47B 88/43 | (2017.01) | |
| H05K 7/14 | (2006.01) | |
| H05K 7/18 | (2006.01) | |

(52) U.S. Cl.
CPC ............ *A47B 88/423* (2017.01); *A47B 88/49* (2017.01); *A47B 88/407* (2017.01); *A47B 88/43* (2017.01); *H05K 7/14* (2013.01); *H05K 7/183* (2013.01)

(58) Field of Classification Search
CPC ....... A47B 88/49; A47B 88/423; A47B 88/43; A47B 88/44; A47B 88/41; A47B 88/403; A47B 88/407; H05K 7/14; H05K 7/183; H05K 7/1489
See application file for complete search history.

(56) References Cited

U.S. PATENT DOCUMENTS

| | | | |
|---|---|---|---|
| 6,230,903 | B1 | 5/2001 | Abbott |
| 9,328,769 | B1 | 5/2016 | Chen |
| 9,545,153 | B2 | 1/2017 | Chen |
| 9,629,459 | B2 | 4/2017 | Chen |
| 10,383,440 | B2 | 8/2019 | Chen |
| 2008/0303390 | A1 | 12/2008 | Hsiung |
| 2016/0331136 | A1* | 11/2016 | Chen .................... H05K 7/1489 |

(Continued)

FOREIGN PATENT DOCUMENTS

| | | | | |
|---|---|---|---|---|
| CN | 108113270 | A * | 6/2018 | ........... H05K 7/1489 |
| EP | 3397035 | A1 * | 10/2018 | ........... A47B 88/423 |

(Continued)

*Primary Examiner* — Tan Le
(74) *Attorney, Agent, or Firm* — Winston Hsu

(57) ABSTRACT

A slide rail assembly includes two components, a first rail, a third rail and a movable rail. The two components are movable longitudinally relative to each other. The first rail and the third rail are respectively arranged at one of the two components and the other one of the two components. A passage is defined between the first ail and the third rail. The movable rail is movably mounted in the passage.

13 Claims, 12 Drawing Sheets

(56) References Cited

U.S. PATENT DOCUMENTS

| | | | | |
|---|---|---|---|---|
| 2017/0340110 A1* | 11/2017 | Chen | ............... | A47B 88/41 |
| 2018/0310710 A1* | 11/2018 | Chen | ............... | A47B 88/423 |
| 2020/0022493 A1* | 1/2020 | Chen | ............... | A47B 88/407 |

FOREIGN PATENT DOCUMENTS

| | | | |
|---|---|---|---|
| JP | 3200963 U | 11/2015 | |
| JP | 3201270 U | 12/2015 | |

* cited by examiner

SLIDE RAIL ASSEMBLY

BACKGROUND OF THE INVENTION

1. Field of the Invention

The present invention relates to a slide assembly, and more particularly, to a slide rail assembly in a range between a retracted state and an extended state, such that a rail member of the slide rail is capable to be easily inserted into the slide rail assembly to connect other rail member from the front or rear, whether in the retracted state or the extended state.

2. Description of the Prior Art

Please refer to FIG. 11. FIG. 11 is a diagram illustrating a slide rail assembly of prior art. As shown in FIG. 11, generally, a slide rail assembly 1100 includes a fixed rail 1102 and a movable rail 1104 movably mounted on a passage 1106 of the fixed rail 1102. Wherein, the fixed rail 1102 has a front end 1102a and a rear end 1102b, and the front end 1102a and the rear end 1102b respectively have a front passage opening 1110 and a rear passage opening 1112 of the passage 1106. A front bracket device 1120 and a rear bracket device 1122 are respectively arranged on the front and rear of the fixed rail 1102. The fixed rail 1102 can be respectively mounted to a front post 1202 and a rear post 1204 of a rack 1200 through at least one first mounting member 1121 of the front bracket device 1120 and at least one second mounting member 1123 of the rear bracket device 1122. A first specification depth L1 is formed between the front post 1202 and the rear post 1204. In other words, the slide rail assembly 1100 can be mounted on the rack 1200 with the first specification depth L1 through the front bracket device 1120 and the rear bracket device 1122. Wherein, the front bracket device 1120 or the rear bracket device 1122 must have the function of retractable length, such that the at least one first mounting member 1121 of the front bracket device 1120 can be mounted to the front post 1202, and the at least one second mounting member 1123 of the rear bracket device 1122 can be mounted to the rear post 1204.

Please refer to FIG. 12. FIG. 12 is a diagram illustrating the slide rail assembly in an extended state of prior art. As shown in FIG. 12, furthermore, taking the rear bracket device 1122 having the function of retractable length as an example, if the rear bracket device 1122 is adjusted to have an extended length in response to the rack 1200 having a second specification depth L2, the second specification depth L2 is formed between the at least one second mounting member 1123 of the rear bracket device 1122 and the at least one first mounting member 1121 of the front bracket device 1120. That is, the slide rail assembly 1100 can be mounted on the rack 1200 with the second specification depth L2 through the front bracket device 1120 and the rear bracket device 1122 with the extended length. When at least one second mounting member 1123 of the rear bracket device 1122 and at least one first mounting member 1121 of the front bracket device 1120 are respectively mounted to the rear post 1204 and the front post 1202, the front end 1102a of the fixed rail 1102 is close to the at least one first mounting member 1121 (or close to the front post 1202). Therefore, when the movable rail 1104 is going to be mounted into the passage 1106 of the fixed rail 1102 from outside the passage 1106 of the fixed rail 1102, if a user stands in front of the at least one first mounting member 1121 or the front post 1202, the user can easily align the movable rail 1104 with the front passage opening 1110 of the front end 1102a of the fixed rail 1102, and insert the movable rail 1104 into the passage 1106 of the fixed rail 1102. However, since the rear bracket device 1122 is adjusted to have the extension length, when the at least one second mounting member 1123 of the rear bracket device 1122 is mounted to the rear post 1204, the rear end 1102b of the fixed rail 1102 will be far away from the at least one second mounting member 1123 (or away from the rear post 1204). Therefore, when the movable rail 1104 is going to be mounted into the passage 1106 of the fixed rail 1102 from outside the passage 1106 of the fixed rail 1102, if the user stands behind the at least one second mounting member 1123 or the rear post 1204, it is difficult (or impossible) to align the movable rail 1104 with the rear passage opening 1112 of the rear end 1102b of the fixed rail 1102 and insert the movable rail 1104 into the passage 1106 of the fixed rail 1102.

However, with the diversification of market requirements, how to develop different slide rail product has become an issue.

SUMMARY OF THE INVENTION

The present invention relates to a slide rail assembly. The slide rail assembly is able to be adjusted length in a range between a retracted state and an extended state, such that a rail member of the slide rail assembly is capable to be easily inserted into the slide rail assembly to connect other rail member from the front or rear, whether in the retracted state or the extended state.

According to an aspect of the present invention, a slide rail assembly comprises a first frame, a second frame, a third frame, a first rail, a second rail, a third rail and a movable rail. The first frame, the second frame and the third frame are movable longitudinally relative to each other. The first rail, the second rail and the third rail are respectively mounted on the first frame, the second frame and the third frame. A corresponding passage is defined by the first rail, the second rail and the third rail. The movable rail is able to be mounted in the passage through one of the first rail and the third rail.

Preferably, the passage is located between a front end of the first rail and a rear end of the third rail.

Preferably, the slide rail assembly further comprises a first bracket device and a second bracket device, wherein the first bracket device comprises a front bracket arranged adjacent to the front end of the first rail, the second bracket device comprises a rear bracket arranged adjacent to the rear end of the third rail.

Preferably, the front bracket comprises a front end plate and at least one first mounting member arranged on the front end plate, the at least one first mounting member is configured to mount the slide rail assembly to a first post of a rack; the rear bracket comprises a rear end plate and at least one second mounting member arranged on the rear end plate, the at least one second mounting member is configured to mount the slide rail assembly to a second post of the rack.

Preferably, one of the front bracket and the rear bracket further comprises a fastener configured to lock the rack.

Preferably, the first rail, the second rail and the third rail respectively comprises a first wall, a second wall and a longitudinal wall connected between the first wall and the second wall, the passage is defined by the first wall, the second wall and the longitudinal wall of the first rail, the second rail and the third rail.

Preferably, the first rail, the second rail and the third rail are located on the same side of the slide rail assembly.

Preferably, a first limiting feature and a second limiting feature that match each other are respectively arranged on the first bracket and the second bracket, when the first bracket and the second bracket are located at a first extended position relative to each other, the first limiting feature and the second limiting feature block each other.

Preferably, a first limiting structure and a second limiting structure that match each other are respectively arranged on the second bracket and the third bracket, when the second bracket and the third bracket are located at a second extended position relative to each other, the first limiting structure and the second limiting structure block each other.

Preferably, a first elastic arm is arranged on one of the first bracket and the second bracket, one of the first limiting feature and the second limiting feature is disposed on the first elastic arm.

Preferably, a second elastic arm is arranged on one of the second bracket and the third bracket, one of the first limiting structure and the second limiting structure is disposed on the second elastic arm Preferably, the first bracket comprises a first portion, a second portion and a longitudinal portion connected between the first portion and the second portion, a first supporting passage is defined by the first portion, the second portion and the longitudinal portion, the first supporting passage is configured to accommodate and support a part of the second bracket.

Preferably, the second bracket comprises a first side, a second side and a longitudinal side connected between the first side and the second side, a second supporting passage is defined by the first side, the second side and the longitudinal side, the second supporting passage is used to accommodate and support a part of the third bracket.

According to an aspect of the present invention, a slide rail assembly comprises two components, a first rail and a third rail and a movable rail. The two components are movable longitudinally relative to each other. The first rail and the third rail are respectively arranged on one of the two components and the other one of the two components. A corresponding passage defined by the first rail and the third rail. The movable rail movably mounted in the passage.

Preferably, the passage is located between a front end of the first rail and a rear end of the third rail.

Preferably, the slide rail assembly further comprises a first bracket device and a second bracket device, wherein the first bracket device comprises a front bracket arranged adjacent to the front end of the first rail, the second bracket device comprises a rear bracket arranged adjacent to the rear end of the third rail.

Preferably, the front bracket comprises a front end plate and at least one first mounting member arranged on the front end plate, the at least one first mounting member is configured to mount the slide rail assembly to a first post of a rack; the rear bracket comprises a rear end plate and at least one second mounting member arranged on the rear end plate, the at least one second mounting member is configured to mount the slide rail assembly to a second post of the rack.

Preferably, one of the front bracket and the rear bracket further comprises a fastener configured to lock the rack.

Preferably, the first rail and the third rail respectively comprises a first wall, a second wall and a longitudinal wall connected between the first wall and the second wall, the passage is defined by the first wall, the second wall and the longitudinal wall of the first rail and the third rail.

Preferably, the first rail and the third rail are located on the same side of the slide rail assembly.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
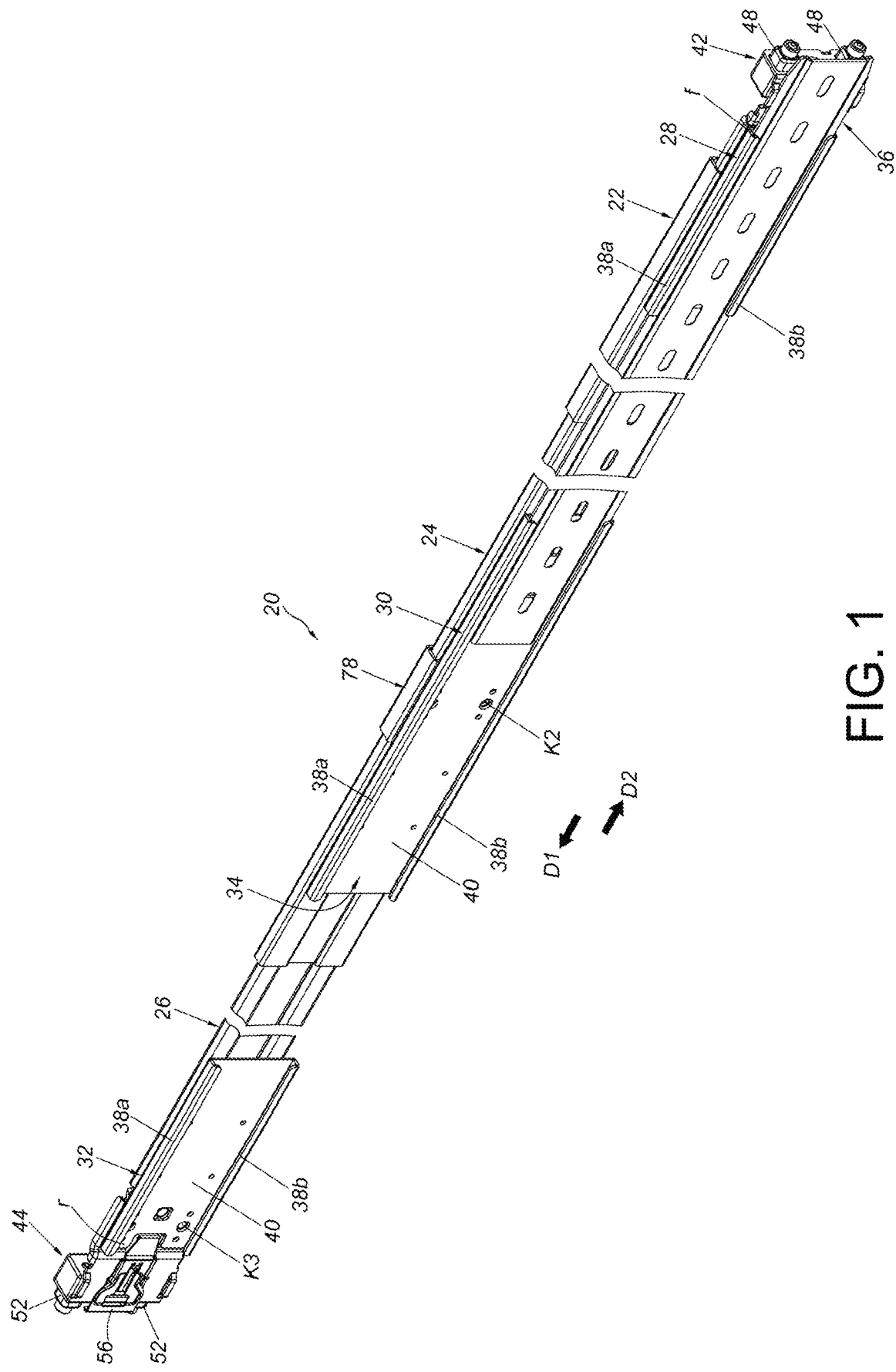
FIG. 1 is a diagram illustrating a slide rail assembly according to an embodiment of the present invention.
Figure 2:
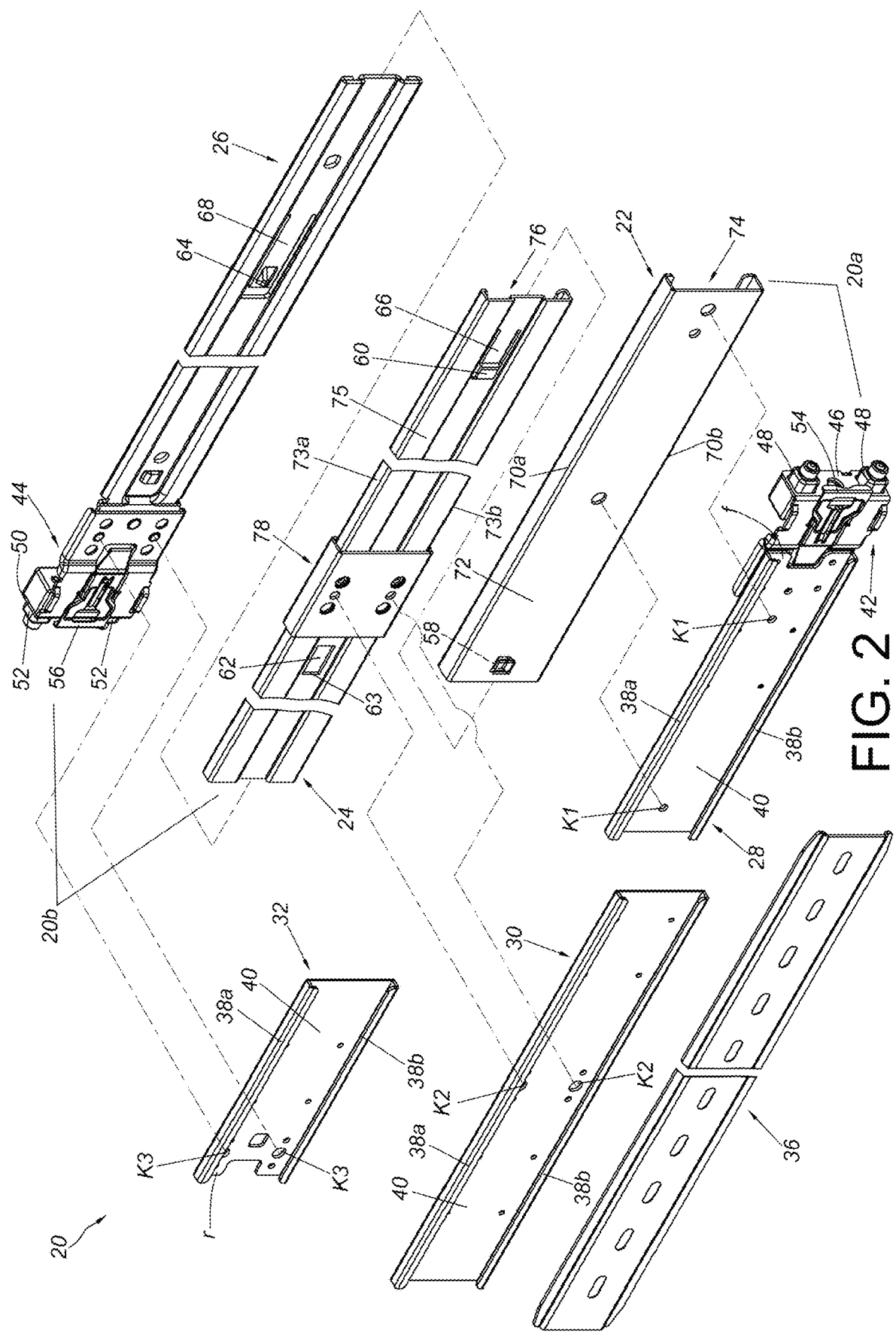
FIG. 2 is an exploded view illustrating the slide rail assembly according to an embodiment of the present invention.

As shown in FIG. 1 in conjunction with FIG. 2, a slide rail assembly 20 of an embodiment of the present invention includes a first bracket device 20a, a second bracket device 20b and a plurality of rail members. Wherein, the first bracket device 20a and the second bracket device 20b can be adjusted to be longitudinally moved relative to each other along a first direction D1 or a second direction D2. The first direction D1 and the second direction D2 are opposite directions. Furthermore, the first bracket device 20a includes a first frame 22 for supporting the second bracket device 20b. The second bracket device 20b further includes a second frame 24 and a third frame 26 that can be adjusted to be moved relative to each other. The third frame 26 is movably connected to the first bracket device 20a through the second frame 24. The plurality of rail members include a first rail 28, a second rail 30 and a third rail 32. Wherein, the first bracket device 20a includes the first rail 28, and the first rail 28 is fixedly connected to the first frame 22. The second rail 30 is fixedly connected to the second frame 24 of the second bracket device 20b. The third rail 32 is fixedly connected to the third frame 26 of the second bracket device 20b. a corresponding passage 34 is defined by each of the aforementioned rails 28, 30, and 32 respectively, and the first rail 28, the second rail 30 and the third rail 32 are independent rail members.

Preferably, two passage openings of the passage 34 that can be inserted are respectively located at a front end f of the first rail 28 and a rear end r of the third rail 32.

Preferably, the first rail 28, the second rail 30 and the third rail 32 respectively include a first wall 38a, a second wall 38b and a longitudinal wall 40 connected between the first wall 38a and the second wall 38a. The passage 34 is defined by the first wall 38a, the second wall 38b and the longitudinal wall 40 of the first rail 28, the second rail 30, and the third rail 32.

Preferably, the first bracket device 20a includes a front bracket 42 arranged adjacent to the front end f of the first rail 28, and the second bracket device 20b includes a rear bracket 44 arranged adjacent to the rear end r of the third rail 32. Wherein, the rear bracket 44 is also connected to an end (e.g., a rear end) of the third frame 26.

Preferably, the front bracket 42 includes a front end plate 46 and at least one first mounting member 48 arranged on the front end plate 46; the rear bracket 44 includes a rear end plate 50 and at least one second mounting member 52 arranged on the rear endplate 50.

Preferably, one of the front bracket 42 and the rear bracket 44 further includes a fastener. Hereinafter, a first fastener 54 and a second fastener 56 are respectively arranged on the front bracket 42 and the rear bracket 44 as an example, but it is not limited specifically.

Preferably, the first rail 28, the second rail 30 and the third rail 32 are located on the same side of the sliding rail assembly 20. For example, the slide rail assembly 20 has a first side and a second side opposite to the first side in position, and the first rail 28, the second rail 30 and the third rail 32 are located on the first side of the slide rail assembly 20; on the other hand, the first frame 22, the second frame 24 and the third frame 26 are located on the second side of the slide rail assembly 20.

Preferably, as shown in FIG. 2, a first limiting feature 58 and a second limiting feature 60 that match each other are respectively arranged on the first frame 22 and the second frame 24. When the first frame 22 and the second frame 24 are located at a first extended position E1 relative to each other (for example, when the second frame 24 is moved relative to the first frame 22 along a first direction D1 to the first extended position E1, this part can refer to FIG. 5), the first limiting feature 58 and the second limiting feature 60 can block each other; on the other hand, a first limiting structure 62 and a second limiting structure 64 that match each other are respectively arranged on the second frame 24 and the third frame 26. When the second frame 24 and the third frame 26 are located at a second extended position E2 relative to each other (For example, when the third frame 26 is moved relative to the second frame 24 along the first direction D1 to the second extended position E2, this part can refer to FIG. 5), the first limiting structure 62 and the second limiting structure 64 can block each other.

Preferably, as shown in FIG. 2, a first elastic arm 66 is arranged on one of the first frame 22 and the second frame 24, and one of the first limiting feature 58 and the second limiting feature 60 is arranged on the first elastic arm 66. Herein after, it is taken as an example that the first elastic arm 66 is arranged on the second frame 24, and the second limiting feature 60 is a protrusion arranged on the first elastic arm 66; on the other hand, the first limiting feature 58 is arranged on the first frame 22, and the first limiting feature 58 is a protrusion. Furthermore, when the second frame 24 is moved relative to the first frame 22 along the first direction D1 to the first extended position E1 (this part can refer to FIG. 5), the first limiting feature 58 and the second limiting feature 60 can block each other, in order to prevent the second frame 24 from being further moved along the first direction D1 from the first extended position E1.

Preferably, as shown in FIG. 2, a second elastic arm 68 is arranged on one of the second frame 24 and the third frame 26, and one of the first limiting structure 62 and the second limiting structure 64 is arranged on the second elastic arm 68. Hereinafter, it is taken as an example that the second elastic arm 68 is arranged on the third frame 26, and the second limiting structure 64 is a protrusion arranged on the second elastic arm 68; on the other hand, the first limiting structure 62 is arranged on the second frame 24, and the first limiting structure 62 is an opening. Furthermore, when the third frame 26 is moved relative to the second frame 24 along the first direction D1 to the second extended position E2 (this part can refer to FIG. 5), the second limiting structure 64 can enter the first limiting structure 62 through the elastic force of the second elastic arm 68. An inner wall 63 of the first limiting structure 62 and the second limiting structure 64 can block each other, in order to prevent the third frame 26 from being moved along the first direction D1 from the second extended position E2.

The limiting structures between the first frame 22 and the second frame 24 are matching structures of two protrusions, or the limiting structures between the second frame 24 and the third frame 26 are matching structures of a convex and a hole. They can be interchanged or replaced by each other, and it is not limited.

Preferably, as shown in FIG. 2, the first frame 22 includes a first portion 70a, a second portion 70b and a longitudinal portion 72 connected between the first portion 70a and the second portion 70b. A first supporting passage 74 is defined by the first portion 70a, the second portion 70b and the longitudinal portion 72. The first supporting passage 74 is configured to accommodate and support apart of the second frame 24.

Preferably, the second frame 24 includes a first side 73a, a second side 73b, and a longitudinal side 75 connected between the first side 73a and the second side 73b. A second supporting passage 76 is defined by the first side 73a, the second side 73b and the longitudinal side 75. The second supporting passage 76 is configured to accommodate and support a part of the third frame 26.

Preferably, as shown in FIG. 2, the slide rail assembly 20 further includes a support base 78 arranged on the second frame 24. The support base 78 has a structural appearance matching the second frame 24. The support base 78 partially covers the first side 73*a*, the second side 73*b* and the longitudinal side 75 of the second frame 24, to improve the supporting strength or structural strength of the second frame 24.

Preferably, as shown in FIG. 2, the first rail 28 is connected to the first frame 22 in a predetermined connection manner through at least one first connection feature K1. The second rail 30 is connected to the second frame 24 and/or the support base 78 in a predetermined connection manner through at least one second connection feature K2. The third rail 32 is connected to the third frame 26 and/or the rear bracket 44 in a predetermined connection manner through at least one third connection feature K3. The predetermined connection manners can be riveting, welding or engaging, but they are not limited specifically.

Preferably, as shown in FIG. 2, the first frame 22 is a reinforcing base to reinforce the structural strength of the first rail 28. The second frame 24 and the third frame 26 can be regarded as two retractable frames of the second bracket device 20*b*.

Figure 3:
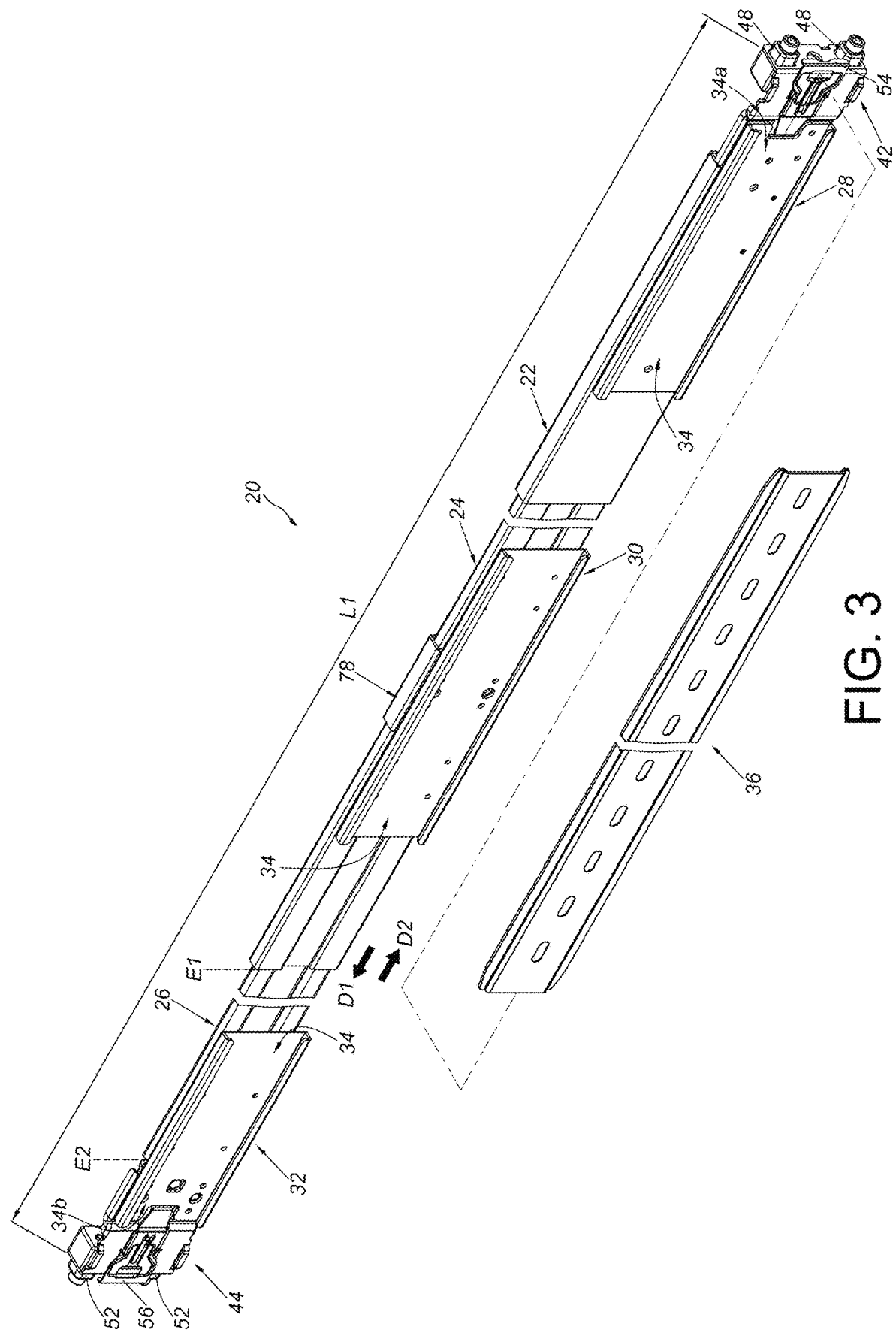
FIG. 3 is a diagram illustrating a first rail and a third rail being moved relative each other through two components and being in an extended state, and a movable rail can be mounted from the first rail to a passage of the first rail according to an embodiment of the present invention.
Figure 4:
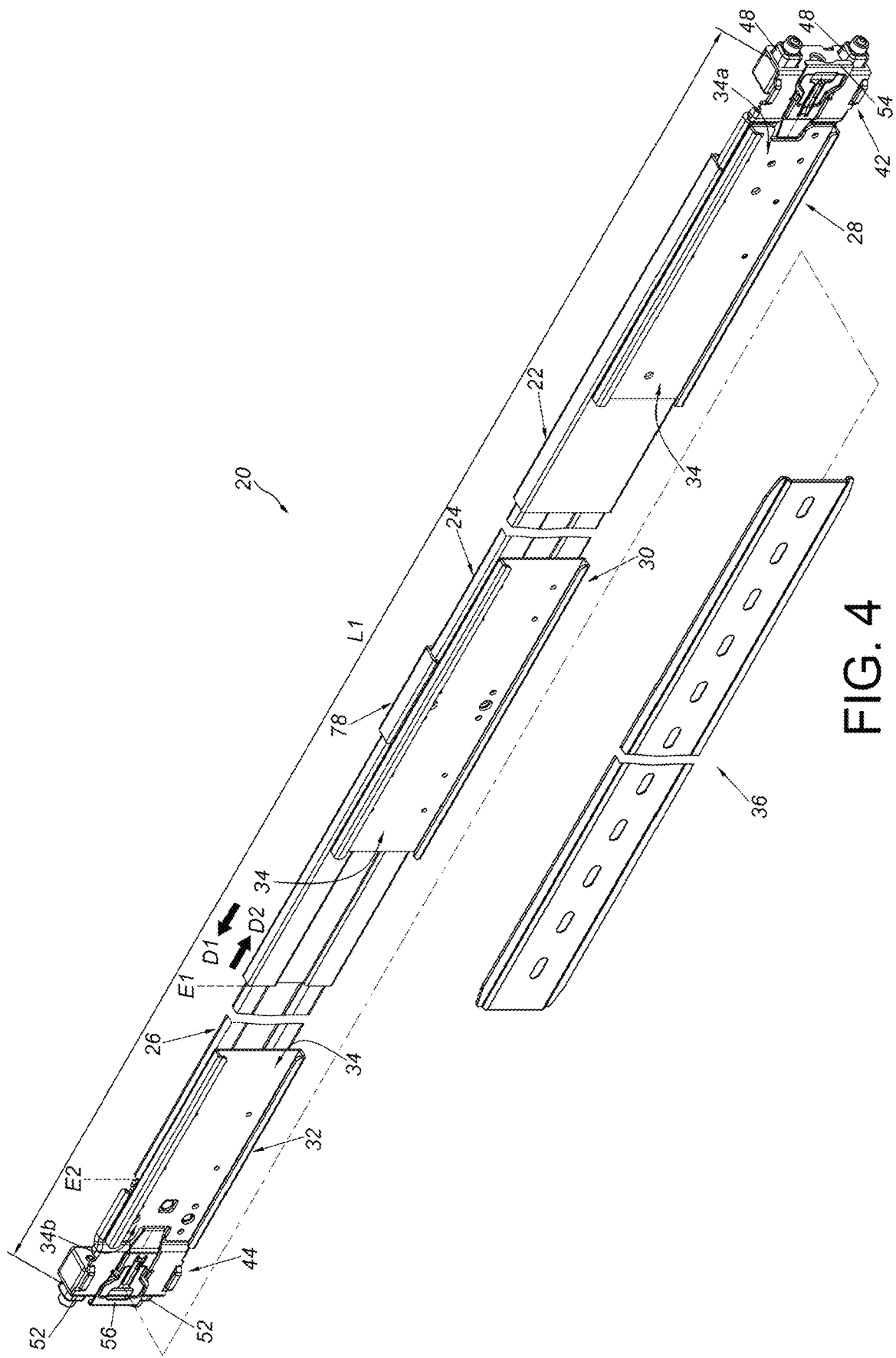
FIG. 4 is a diagram illustrating the first rail and the third rail being moved relative each other through the two components and being in the extended state, and the movable rail can be mounted from the third rail to the passage of the third rail according to an embodiment of the present invention.
Figure 5:
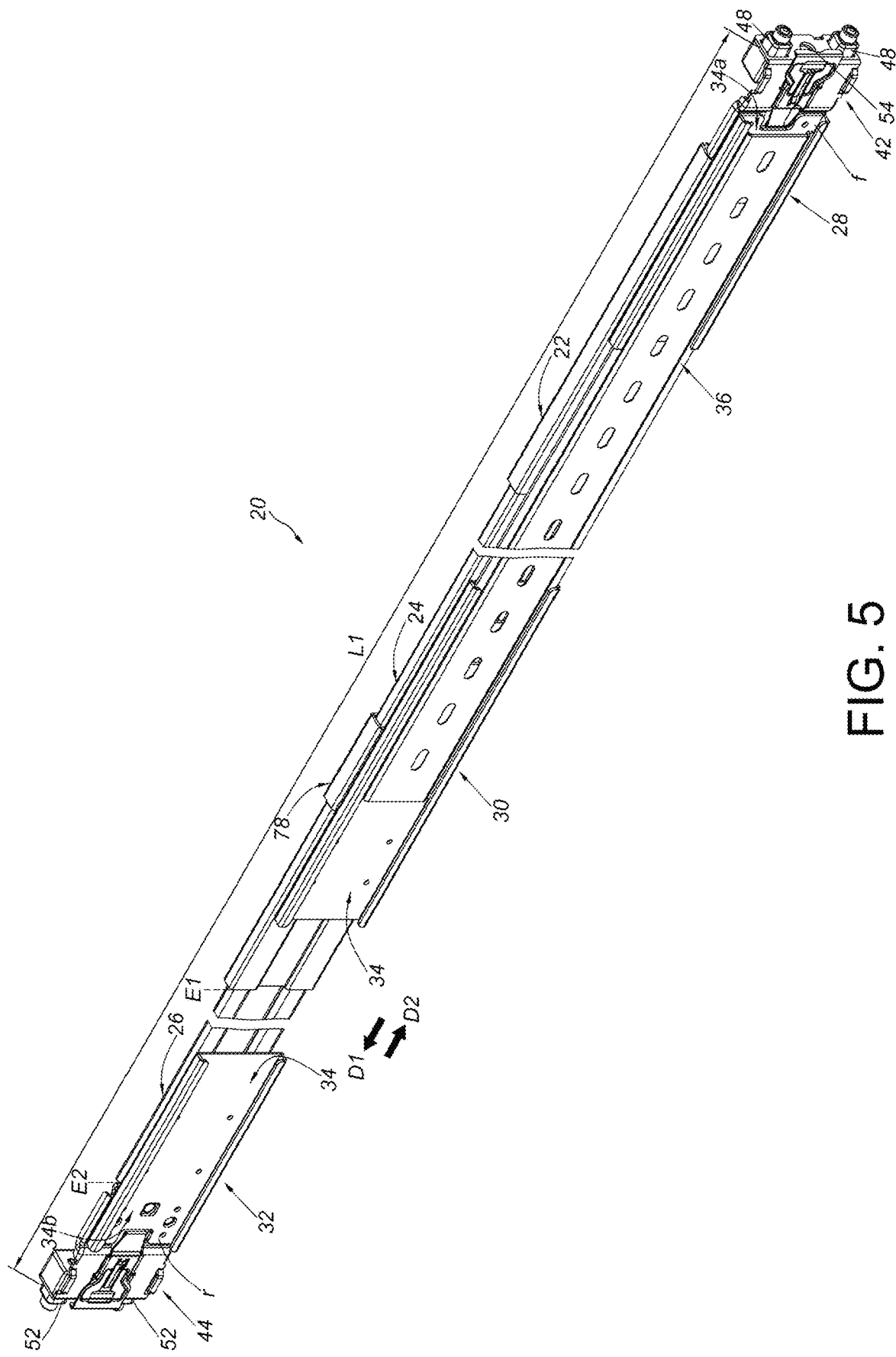
FIG. 5 is a diagram illustrating the first rail and the third rail of the slide rail assembly being moved relative each other through the two components and being in the extended state according to an embodiment of the present invention.

As shown in FIG. 3, FIG. 4 and FIG. 5, the first frame 22, the second frame 24 and the third frame 26 can be longitudinally moved relative to each other in the first direction D1 or the second direction D2 within a limited range, For example, when the second frame 24 is moved relative to the first frame 22 along the first direction D1 to the first extended position E1 and the third frame 26 is moved relative to the second frame 24 along the first direction D1 to the second extended position E2, a first predetermined length L1 is formed between the first mounting member 48 of the front bracket 42 and the second mounting member 52 of the rear bracket 44. At this time, the first rail 28 and the third rail 32 are relatively far away from each other and are in an extended state.

Furthermore, in the extended state, the movable rail 36 can still be mounted to the passage 34 from one of the first rail 28 and the third rail 32. For example, an user can insert the movable rail 36 into the passage 34 from a front passage opening 34*a* of the first rail 28 (as shown in FIG. 3 and FIG. 5); alternatively, the user can also insert the movable rail 36 into the passage 34 from a rear passage opening 34*b* of the third rail 32 (as shown in FIG. 4). Wherein, when the movable rail 36 is mounted in the passage 34, the movable rail 36 can be moved along the first direction D1 or the second direction D2 in the passage 34 (as shown in FIG. 5).

Figure 6:
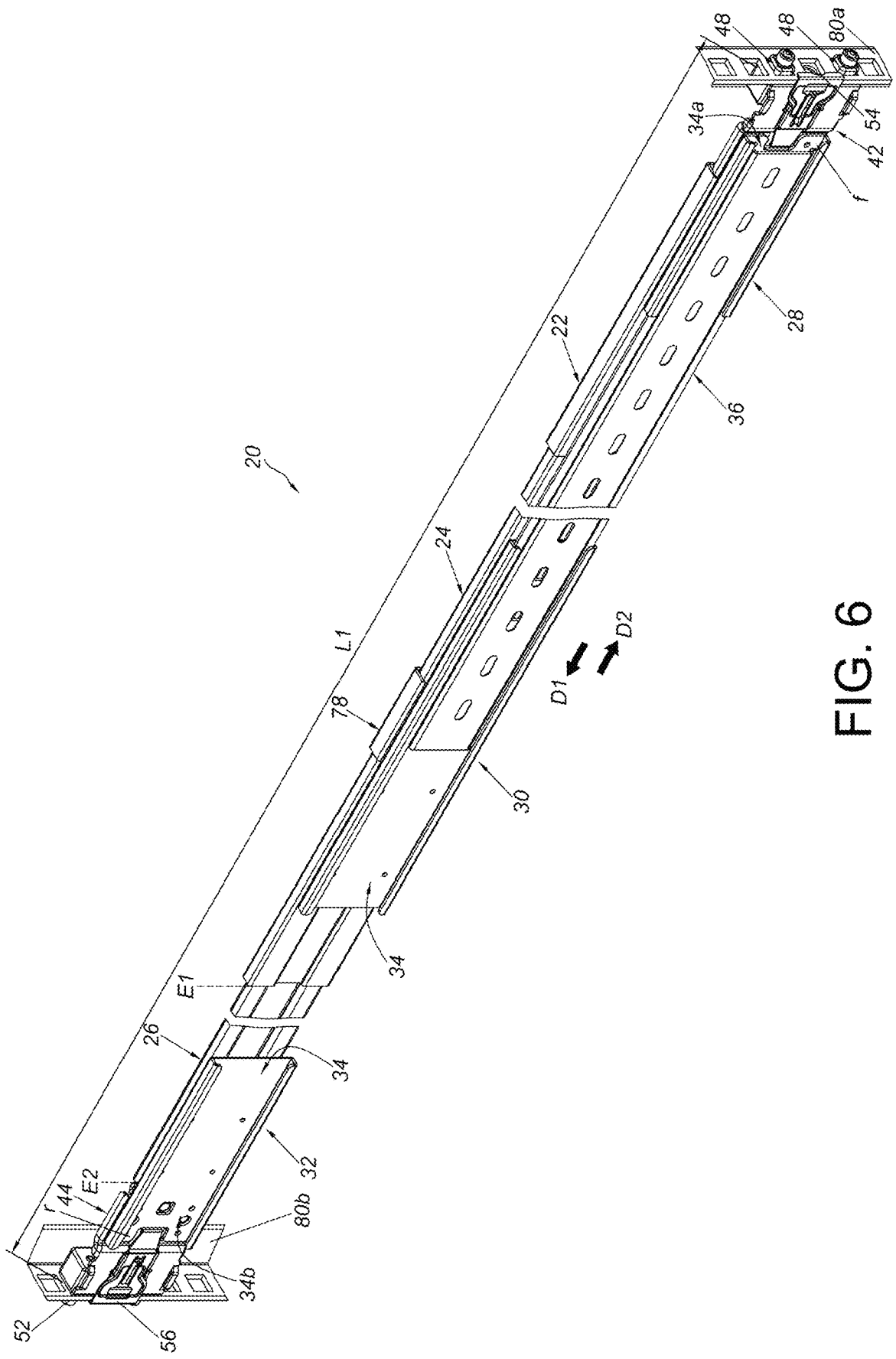
FIG. 6 is a diagram illustrating the first rail and the third rail being moved relative each other through the two components and being in the extended state, and the slide rail assembly being mounted to a rack according to an embodiment of the present invention.

As shown in FIG. 6, the slide rail assembly 20 can be mounted on a first post 80*a* and a second post 80*b* of a rack, wherein a first longitudinal distance is formed between the first post 80*a* and the second post 80*b*. The second frame 24 is located at the first extended position E1 relative to the first frame 22 and the third frame 26 is located at the second extended position E2 relative to the second frame 24, such that there is the first predetermined length L1 between the first mounting member 48 of the front bracket 42 and the second mounting member 52 of the rear bracket 44. The first predetermined length L1 can match the first longitudinal distance, such that the first mounting member 48 can be mounted to the first post 80*a* and the second mounting member 52 can be mounted to the second post 80*b*. Preferably, the first fastener 54 can be configured to lock the first post 80*a* of the rack, and the second fastener 56 can be configured to lock the second post 80*b* of the rack.

It is noticed that the front bracket 42 is arranged adjacent to the front end f of the first rail 28, and the first rail 28 is arranged on the first frame 22, and the rear bracket 44 is arranged adjacent to the rear end r of the third rail 32, and the third rail 32 is arranged on the third frame 26. Therefore, in the extended state where the first rail 28 and the third rail 32 are relatively far away from each other, when the first mounting member 48 of the front bracket 42 and the second mounting member 52 of the rear bracket 44 are respectively mounted to the first post 80*a* and the second post 80*b*, it can be ensured that the front end f of the first rail 28 is close to the first mounting member 48 (or close to the first post 80*a*), and it can be also ensured that the rear end r of the third rail 32 is close to the second mounting member 52 (or close to the second post 80*b*). Accordingly, when the user stands in front of the first mounting member 48 or the first post 80*a*, it is still convenient for the user to insert and mount the movable rail 36 from the front passage opening 34*a* of the first rail 28 into the passage 34; alternatively, when the user stands behind the second mounting member 52 or the second post 80*b*, it is also convenient for the user to mount the movable rail 36 from the rear passage opening 34*b* of the third rail 32 to the passage 34 (this part can refer to FIG. 3 to FIG. 5 and the description thereto). The advantage of this structure is that: when the slide rail assembly is mounted on the left and right sides of the rack, even if the left and right directions are mounted reversely and the slide rail assembly is adjusted to the extended state, the insertion of the movable rail is not affected.

In addition, when the first rail 28 and the third rail 32 are relatively far away from each other and are in the extended state, the length between the front end f of the first rail 28 and the rear end r of the third rail 32 is much greater than the length of the movable rail 36. The reason for this design is that: the slide rail assembly also has to be used in a reduced length state. Therefore, the movable rail 36 has to be able to meet both the reduced length state and the extended state.

When the slide rail assembly 20 is in the extended state, in the embodiment of the present invention, the second rail 30 is used to fill the empty section or space left by the extension between the first rail 28 and the third rail 32, which helps when the movable rail 36 is inserted and mounted into the passage 34 from the front passage opening 34*a* of the first rail 28, at least two rail sections (such as a front rail section and a rear rail section) of the movable rail 36 can be supported by the first rail 28 and the second rail 30, such that it is also advantageous for the movable rail 36 to be moved along the first direction D1 and easily to be guided into the passage 34 of the third rail 32; alternatively, it helps when the movable rail 36 is inserted and mounted into the passage 34 from the rear passage opening 34*b* of the third rail 32, at least two rail sections (such as the front rail section and the rear rail section) of the movable rail 36 can be supported by the third rail 32 and the second rail 30, such that it is also advantageous for the movable rail 36 to be moved along the second direction D2 and easily to be guided into the passage 34 of the first rail 28.

Figure 7:
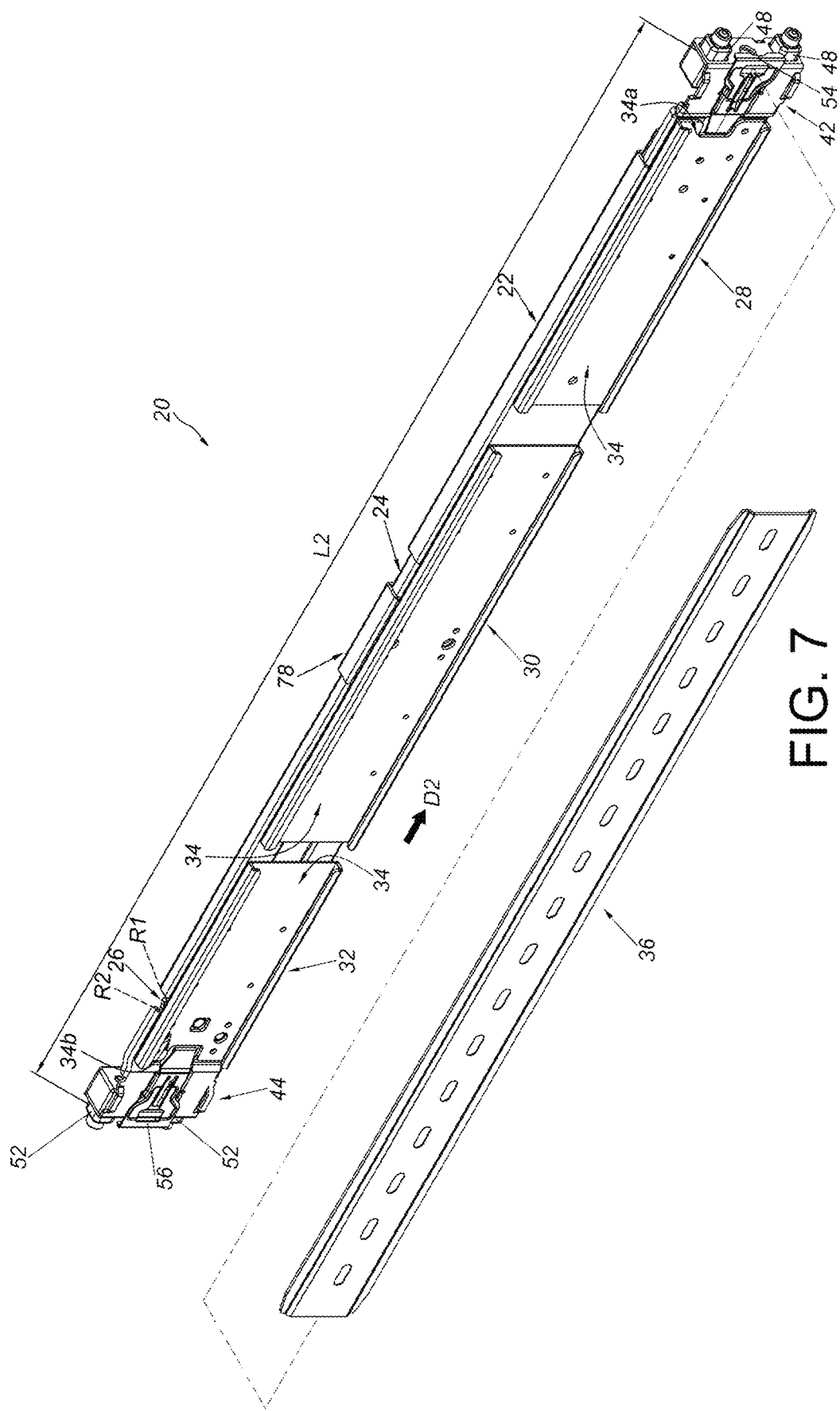
FIG. 7 is a diagram illustrating the first rail and the third rail being moved relative each other through the two components and being in a retracted state, and the movable rail can be mounted from the first rail to the passage of the first rail according to an embodiment of the present invention.
Figure 8:
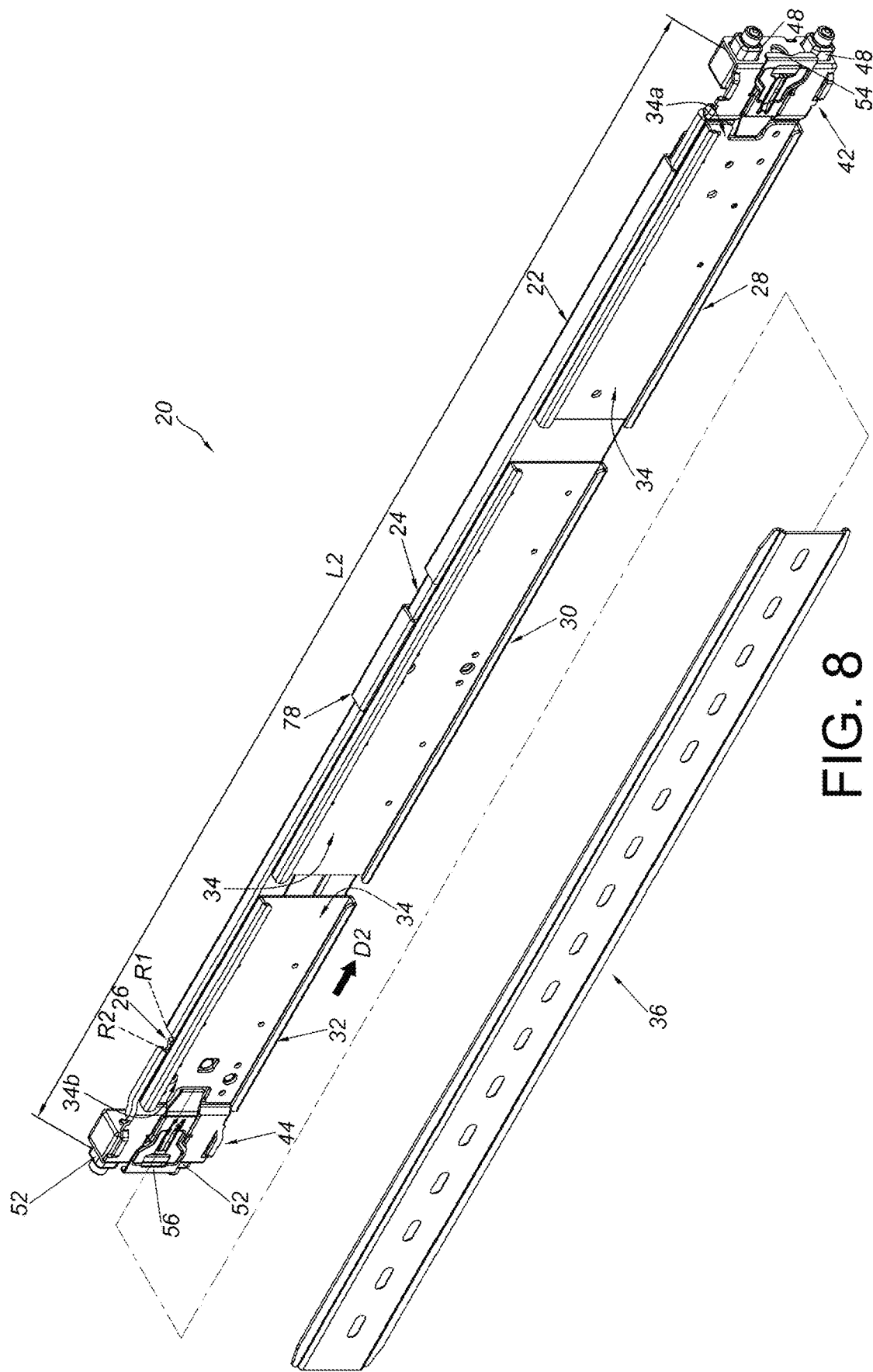
FIG. 8 is a diagram illustrating the first rail and the third rail being moved relative each other through the two components and being in the retracted state, and the movable rail can be mounted from the third rail to the passage of the third rail according to an embodiment of the present invention.
Figure 9:
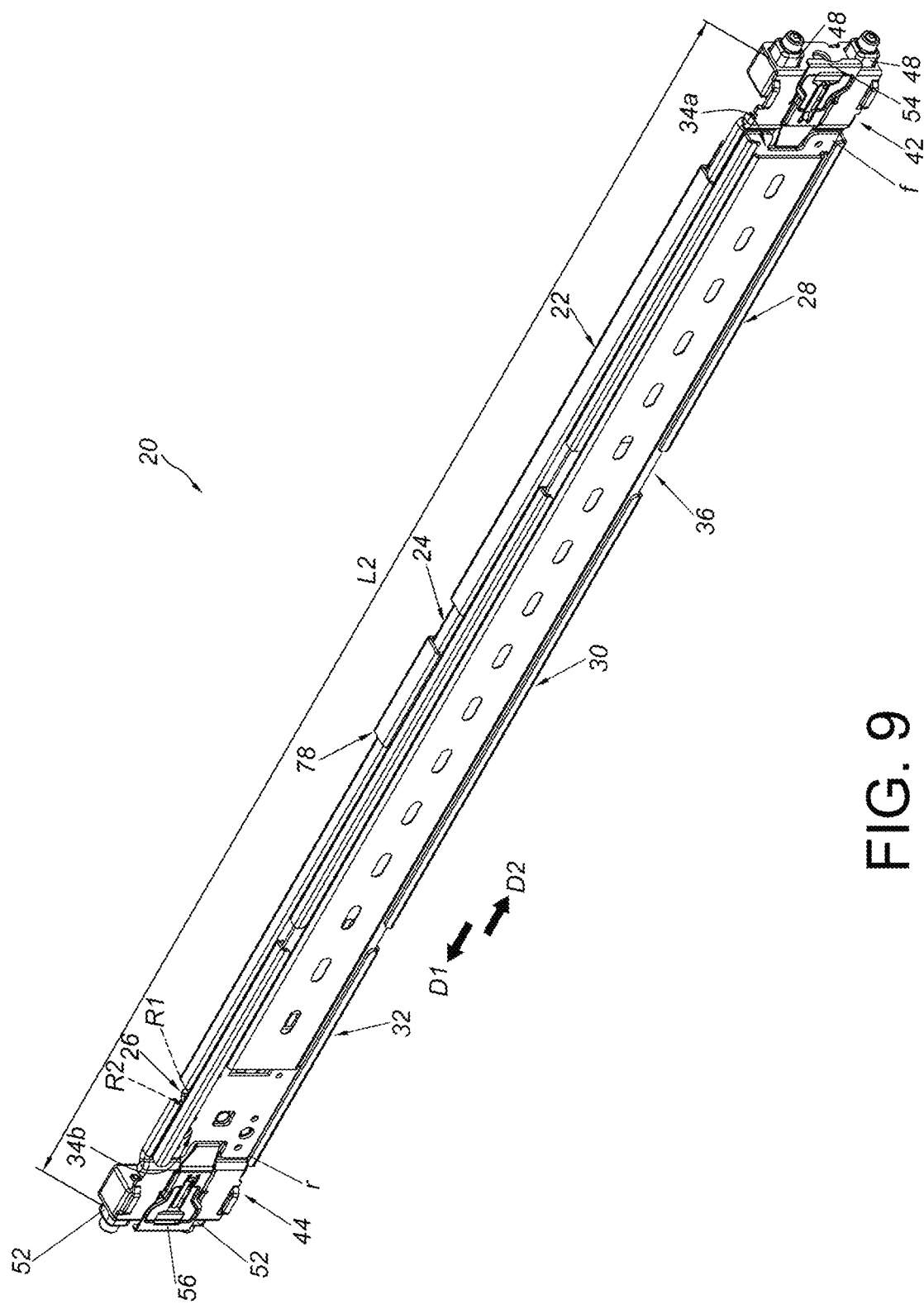
FIG. 9 is a diagram illustrating the first rail and the third rail of the slide rail assembly being moved relative each other through the two components and being in the retracted state according to an embodiment of the present invention.

As shown in FIG. 7, FIG. 8 and FIG. 9, when the second frame 24 is moved relative to the first frame 22 from the first extended position E1 along the second direction D2 to a first retracted position R1 and the third frame 26 is moved relative to the second frame 24 from the second extended position E2 along the second direction D2 to a second retracted position R2, a second predetermined length L2 is formed between the first mounting member 48 of the front bracket 42 and the second mounting member 52 of the rear bracket 44, and the second predetermined length L2 is smaller than the above-mentioned first predetermined length L1. At this time, the first rail 28 and the third rails 32 are relatively close to each other and are in a retracted state.

Furthermore, in the retracted state, the movable rail 36 can be mounted into the passage 34 from one of the first rail 28 and the third rail 32. For example, the user can insert the movable rail 36 into the passage 34 from the front passage opening 34a of the first rail 28 (as shown in FIG. 7 and FIG. 9); alternatively, the user can also insert the movable rail 36 into the passage 34 from the rear passage opening 34b of the third rail 32 (as shown in FIG. 8). Wherein, when the movable rail 36 is mounted into the passage 34, the movable rail 36 is movable along the first direction D1 or the second direction D2 in the passage 34 (as shown in FIG. 9).

Figure 10:
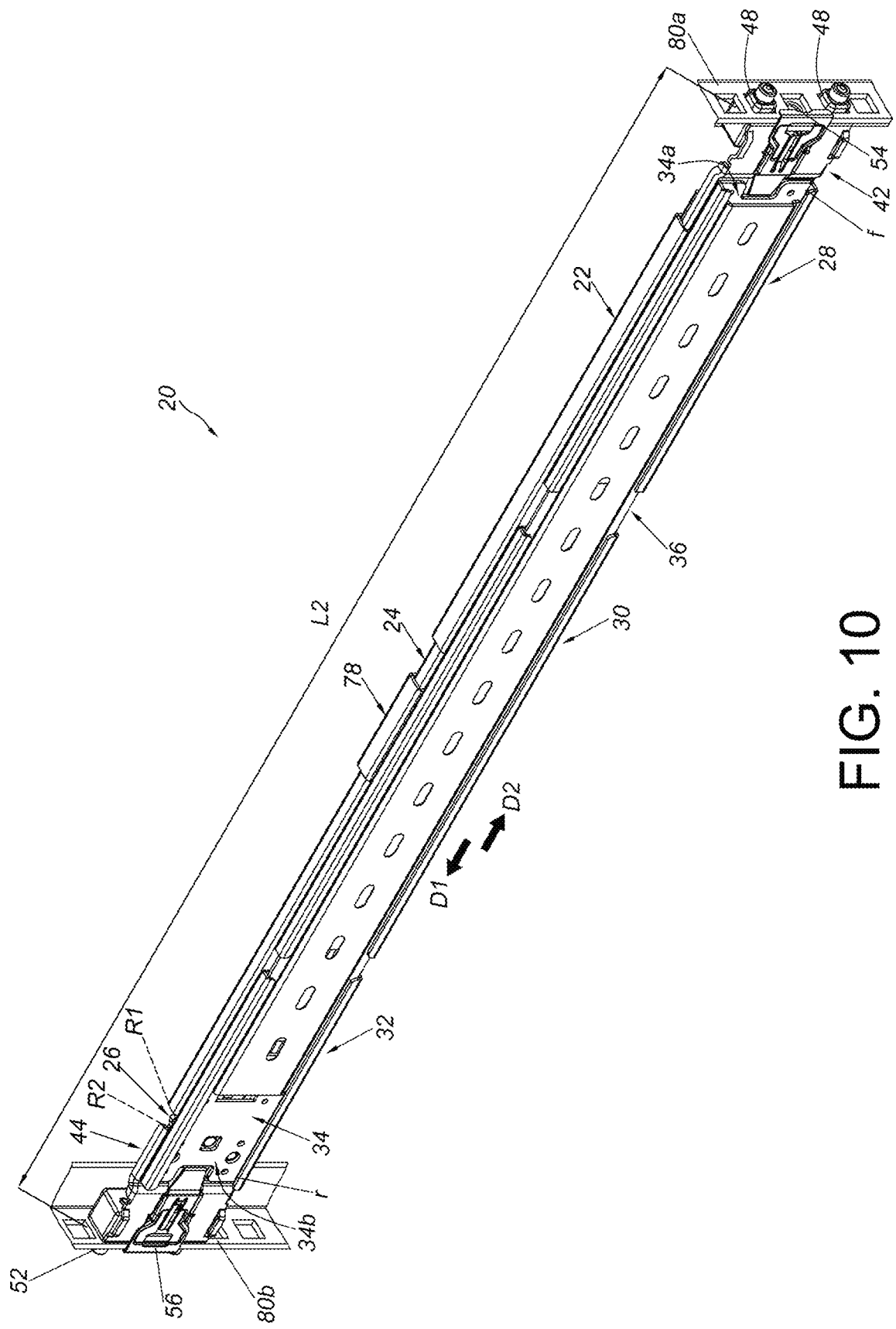
FIG. 10 is a diagram illustrating the first rail and the third rail being moved relative each other through the two components and being in the retracted state, and the slide rail assembly being mounted to the rack according to an embodiment of the present invention.
Figure 11:
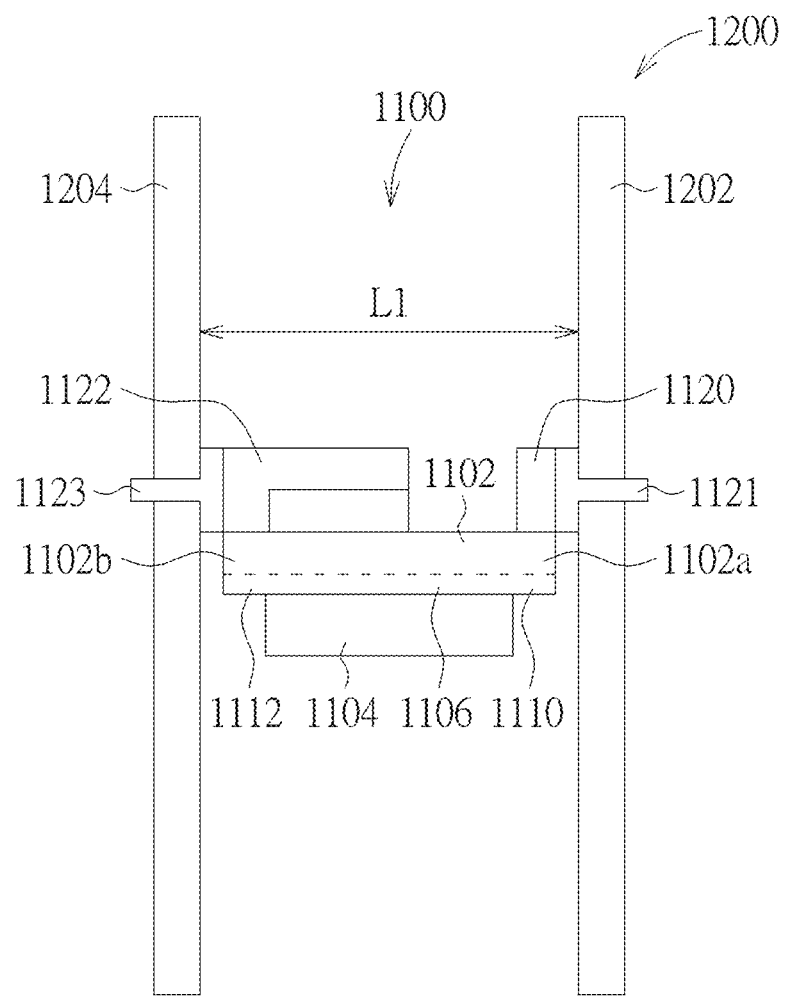
FIG. 11 is a diagram illustrating a slide rail assembly being mounted on a rack with a first specification depth through a front bracket device and a rear bracket device of prior art.
Figure 12:
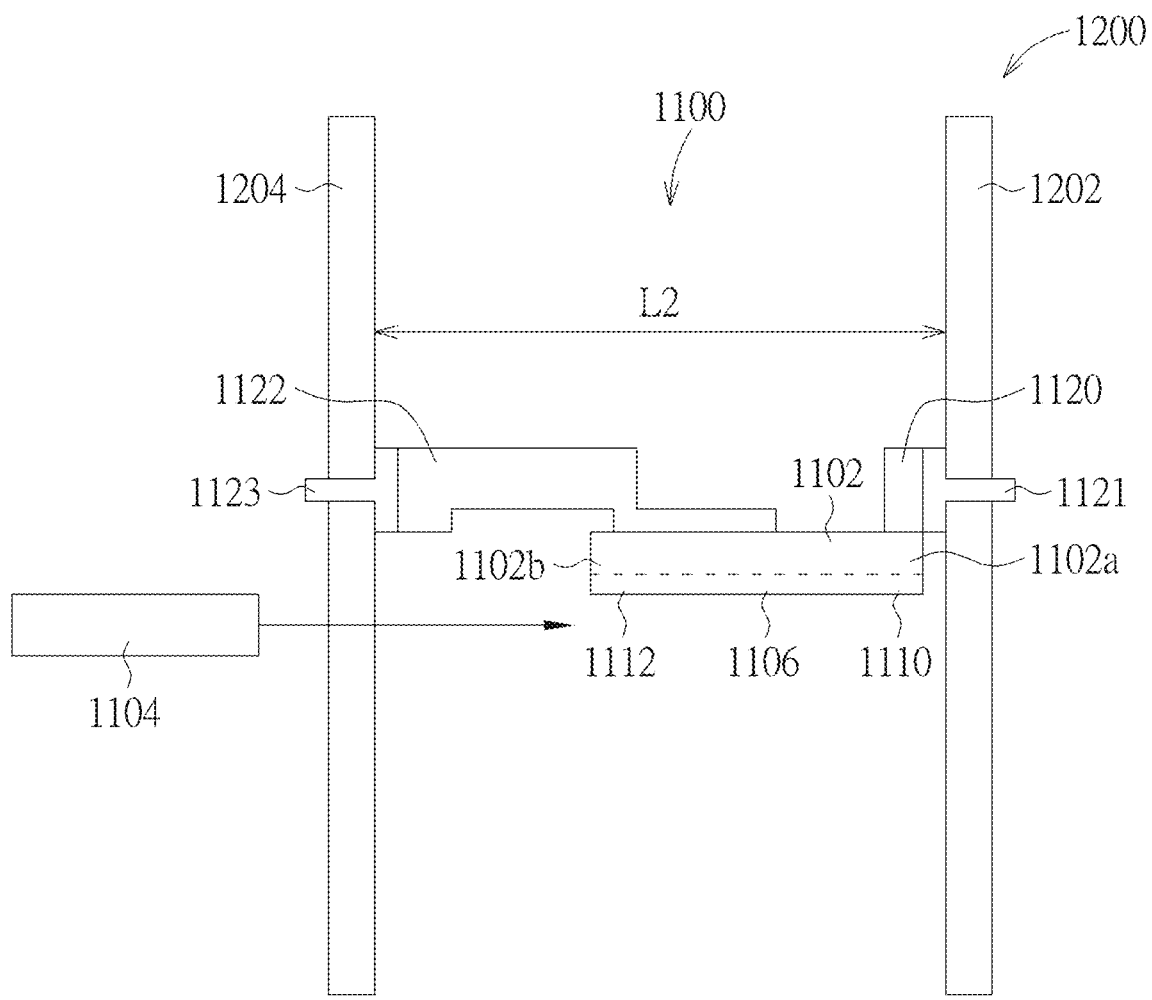
FIG. 12 is a diagram illustrating the slide rail assembly being mounted on a rack with a second specification depth through the front bracket device and the rear bracket device of prior art.

As shown in FIG. 10, the slide rail assembly 20 is applicable to the first post 80a and the second post 80b. Wherein, a second longitudinal distance is formed between the first post 80a and the second post 80b, and the second longitudinal distance is smaller than the aforementioned first longitudinal distance. The second frame 24 is located at the first retracted position R1 relative to the first frame 22, and the third frame 26 is located at the second retracted position R2 relative to the second frame 24, such that the second predetermined length L2 is formed between the first mounting member 48 of the front bracket 42 and the second mounting member 52 of the rear bracket 44, and the second predetermined length L2 is smaller than the first predetermined length L1. Furthermore, the second predetermined length L2 can match the second longitudinal distance, such that the first mounting member 48 can be mounted to the first post 80a, and the second mounting member 52 can be mounted to the second post 80b. Preferably, the first fastener 54 may be configured to lock the first post 80a of the rack, and the second fastener 56 may be configured to lock the second post 80b of the rack.

It is noticed that the front bracket 42 is arranged adjacent to the front end f of the first rail 28, and the first rail 28 is arranged on the first frame 22, and the rear bracket 44 is arranged adjacent to the rear end r of the third rail 32, and the third rail 32 is arranged on the third frame 26. Therefore, in the retracted state where the first rail 28 and the third rail 32 are relatively close to each other, when the first mounting member 48 of the front bracket 42 and the second mounting member 52 of the rear bracket 44 are respectively mounted to the first post 80a and the second post 80b, it can be ensured that the front end f of the first rail 28 is close to the first mounting member 48 (or close to the first post 80a), and it can also be ensured that the rear end r of the third rail 32 is close to the second mounting member 52 (or close to the second post 80b). Accordingly, when the user stands in front of the first mounting member 48 or the first post 80a, it is convenient for the user to mount the movable rail 36 from the front passage opening 34a of the first rail 28 into the passage 34; alternatively, when the user stands behind the second mounting member 52 or the second post 80b, it is also convenient for the user to mount the movable rail 36 from the rear passage opening 34b of the third rail 32 into the passage 34 (this part can refer to FIG. 7 to FIG. 9 and the description thereto).

In addition, in the retracted state where the first rail 28 and the third rail 32 are relatively close to each other, compared with the above-mentioned first rail 28 and the third rail 32 being in the extended state relative to each other, the length between the front end f of the first rail 28 and the rear end r of the third rail 32 will be more matched (or substantially the same) to the length of the movable rail 36 in the retracted state. Therefore, when the movable rail 36 is mounted from the front passage opening 34a of the first rail 28 or from the rear passage opening 34b of the third rail 32 into the passage 34, at least three rail sections (such as the front rail section, the mediate rail section and the rear rail section) of the movable rail 36 can be supported by the first rail 28, the second rail 30 and the third rail 32.

Compared to the prior art, the slide rail assembly 20 of the present embodiment has advantages over the prior art by the following perspectives:

1. Through the relative movement of the two components (such as the first frame 22 and the third frame 26), the first rail 28 and the third rail 32 can be in the extended state or the retracted state relative to each other, and in the extended state or the retracted state, the movable rail 36 can be mounted into the passage 34 from one of the first rail 28 and the third rail 32.

2. In the extended state where the first rail 28 and the third rail 32 are relatively far away from each other, the second rail 30 can make up for the empty section or gap between the first rail 28 and the third rail 32, the second rail 30 is used to fill the empty section or space left by the extension between the first rail 28 and the third rail 32, which helps when the movable rail 36 is mounted into the passage 34 from the front passage opening 34a of the first rail 28, at least two rail sections (such as the front rail section and the rear rail section) of the movable rail 36 can be supported by the first rail 28 and the second rail 30, such that it is also advantageous for the movable rail 36 to be moved along the first direction D1 and easily to be guided into the third rail 32; alternatively, it helps when the movable rail 36 is mounted into the passage 34 from the rear passage opening 34b of the third rail 32, at least two rail sections (such as the front rail section and the rear rail section) of the movable rail 36 can be supported by the third rail 32 and the second rail 30, such that it is also advantageous for the movable rail 36 to be moved along the second direction D2 and easily to be guided into the passage 34 of the first rail 28.

3. In the retracted state where the first rail 28 and the third rail 32 are relatively close to each other, when the movable rail 36 is mounted from the front passage opening 34a of the first rail 28 or from the rear passage opening 34b of the third rail 32 into the passage 34, at least three rail sections (such as the front rail section, the mediate rail section and the rear rail section) of the movable rail 36 can be supported by the first rail 28, the second rail 30 and the third rail 32.

4. The front bracket 42 is arranged adjacent to the front end f of the first rail 28, and the first rail 28 is arranged on the first frame 22, and the rear bracket 44 is arranged adjacent to the rear end r of the third rail 32, and the third rail 32 is arranged on the third frame 26. According to above arrangement, when the front bracket 42 and the rear bracket 44 are respectively mounted to the first post 80a and the second post 80b, it can be ensured that the front end f of the first rail 28 is close to the first mounting member 48 (or close to the first post 80a), it can be also ensure that the rear end r of the third rail 32 is close to the second mounting member 52 (or close to the second post 80b). Accordingly, when the user stands in front of the first post 80a, it is convenient for the user to mount the movable rail 36 from the front passage opening 34a of the first rail 28 into the passage 34; alternatively, when the user stands behind the second post 80b, it is also convenient for the user to mount the movable rail 36 from the rear passage opening 34b of the third rail 32 into the passage 34.

5. The support base 78 partially covers the first side 73a, the second side 73b and the longitudinal side 75 of the second frame 24, in order to improve the supporting strength and structural strength of the second frame 24.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A slide rail assembly, comprising:
a first frame, a second frame and a third frame movable longitudinally relative to each other;
a first rail, a second rail and a third rail respectively mounted on the first frame, the second frame and the third frame; a corresponding passage defined by the first rail, the second rail and the third rail; and
a movable rail, able to be mounted in the passage through one of the first rail and the third rail.

2. The slide rail assembly of claim 1, wherein the passage is located between a front end of the first rail and a rear end of the third rail.

3. The slide rail assembly of claim 2, further comprising:
a first bracket device and a second bracket device, wherein the first bracket device comprises a front bracket arranged adjacent to the front end of the first rail, the second bracket device comprises a rear bracket arranged adjacent to the rear end of the third rail.

4. The slide rail assembly of claim 3, wherein the front bracket comprises a front end plate and at least one first mounting member arranged on the front end plate, the at least one first mounting member is configured to mount the slide rail assembly to a first post of a rack; the rear bracket comprises a rear end plate and at least one second mounting member arranged on the rear end plate, the at least one second mounting member is configured to mount the slide rail assembly to a second post of the rack.

5. The slide rail assembly of claim 4, wherein one of the front bracket and the rear bracket further comprises a fastener configured to lock the rack.

6. The slide rail assembly of claim 1, wherein the first rail, the second rail and the third rail respectively comprises a first wall, a second wall and a longitudinal wall connected between the first wall and the second wall, the passage is defined by the first wall, the second wall and the longitudinal wall of the first rail, the second rail and the third rail.

7. The slide rail assembly of claim 1, wherein the first rail, the second rail and the third rail are located on the same side of the slide rail assembly.

8. The slide rail assembly of claim 1, wherein a first limiting feature and a second limiting feature that match each other are respectively arranged on the first frame and the second frame, when the first frame and the second frame are located at a first extended position relative to each other, the first limiting feature and the second limiting feature block each other.

9. The slide rail assembly of claim 8, wherein a first limiting structure and a second limiting structure that match each other are respectively arranged on the second frame and the third frame, when the second frame and the third frame are located at a second extended position relative to each other, the first limiting structure and the second limiting structure block each other.

10. The slide rail assembly of claim 9, wherein a first elastic arm is arranged on one of the first frame and the second frame, one of the first limiting feature and the second limiting feature is disposed on the first elastic arm.

11. The slide rail assembly of claim 10, wherein a second elastic arm is arranged on one of the second frame and the third frame, one of the first limiting structure and the second limiting structure is disposed on the second elastic arm.

12. The slide rail assembly of claim 1, wherein the first frame comprises a first portion, a second portion and a longitudinal portion connected between the first portion and the second portion, a first supporting passage is defined by the first portion, the second portion and the longitudinal portion, the first supporting passage is configured to accommodate and support a part of the second frame.

13. The slide rail assembly of claim 12, wherein the second frame comprises a first side, a second side and a longitudinal side connected between the first side and the second side, a second supporting passage is defined by the first side, the second side and the longitudinal side, the second supporting passage is used to accommodate and support a part of the third frame.

* * * * *